United States Patent
Bjornsen (10) Patent No.: US 7,221,299 B2
(45) Date of Patent: May 22, 2007

(54) METHOD AND APPARATUS FOR AN ADC CIRCUIT WITH WIDER INPUT SIGNAL SWING

(75) Inventor: Johnny Bjornsen, Trondheim (NO)

(73) Assignee: Nordic Semiconductor ASA, Tiller (NO)

( * ) Notice: Subject to any disclaimer, the term of this patent is extended or adjusted under 35 U.S.C. 154(b) by 0 days.

(21) Appl. No.: 11/151,934

(22) Filed: Jun. 13, 2005

(65) Prior Publication Data

US 2005/0275578 A1    Dec. 15, 2005

Related U.S. Application Data

(60) Provisional application No. 60/579,103, filed on Jun. 12, 2004.

(51) Int. Cl.
*H03M 1/20* (2006.01)
(52) U.S. Cl. ........................... 341/131; 341/155
(58) Field of Classification Search ................ 341/143, 341/144, 155, 139, 131, 120
See application file for complete search history.

(56) References Cited

U.S. PATENT DOCUMENTS

| | | | | |
|---|---|---|---|---|
| 4,857,927 A * | 8/1989 | Takabayashi | ............... | 341/131 |
| 4,996,530 A * | 2/1991 | Hilton | ............... | 341/120 |
| 5,187,481 A * | 2/1993 | Hiller | ............... | 341/131 |
| 5,905,453 A * | 5/1999 | Kase | ............... | 341/143 |
| 5,940,138 A * | 8/1999 | Lowe | ............... | 348/574 |
| 6,351,229 B1 * | 2/2002 | Wang | ............... | 341/143 |
| 6,404,364 B1 * | 6/2002 | Fetterman et al. | ............... | 341/131 |
| 6,462,685 B1 * | 10/2002 | Korkala | ............... | 341/131 |
| 6,473,019 B1 * | 10/2002 | Ruha et al. | ............... | 341/143 |

OTHER PUBLICATIONS

Siragusa et al., "Gain Error Correction Technique for Pipelined Analogue-to-Digital Converters," Electronics Letters, vol. 36, No. 7, Mar. 30, 2000.
Siragusa et al., "A Digitally Enhanced 1.8-V 15-bit 40-MSample/s CMOS Pipelined ADC," IEEE Journal of Solid-State Circuits, vol. 39, No. 12, Dec. 2004.
Qin et al., "Sigma-Delta ADC with Reduced Sample Rate Multibit Quantizer," IEEE Transactions on Circuits and Systems-II Analog and Digital Signal Processing, vol. 46, No. 6, Jun. 1999, 824-828.

* cited by examiner

*Primary Examiner*—Peguy JeanPierre
(74) *Attorney, Agent, or Firm*—Marshall, Gerstein & Borun LLP (57) ABSTRACT

An analog-to-digital converter (ADC) system that converts an analog input signal into a digital output circuit uses a method of shaping a pseudo-random signal such that the ADC system can be used with input signals having wider swings. The ADC system also includes a quantizer having a comparator offset of less than =/−¼ least significant bit (LSB) in a stage calibrated for gain errors. A method of operating an ADC circuit includes measuring an amplitude and polarity of an input signal voltage and changing characteristics of a pseudo-random signal to ensure that a subsequent stage of the ADC circuit is not saturated. An implementation of the ADC circuit alters the pseudo-random signal based on the amplitude of the input signal such that when the input signal goes close to a positive rail, the pseudo-random signal alternates between a first range, and when the input signal goes close to a negative rail, the pseudo-random signal alternates between a second range.

19 Claims, 7 Drawing Sheets

FIG. 7b

METHOD AND APPARATUS FOR AN ADC CIRCUIT WITH WIDER INPUT SIGNAL SWING

CROSS-REFERENCES TO RELATED APPLICATIONS

This application claims priority to U.S. Provisional Application Ser. No. 60/579,103, entitled, "Method and Apparatus for Operating an ADC Circuit with Wider Input Signal Swing," filed Jun. 12, 2004, the disclosure of which is hereby expressly incorporated herein by reference.

TECHNICAL FIELD

This patent relates generally to analog-to-digital converters, and more specifically to an apparatus and a method for operating a pipelined analog-to-digital converter.

BACKGROUND

Analog-to-digital converters (ADCs) are employed in a variety of electronic systems including computer modems, wireless telephones, satellite receivers, process control systems, etc. Such systems demand cost-effective ADCs that can efficiently convert an analog input signal to a digital output signal over a wide range of frequencies and signal magnitudes with minimal noise and distortion.

An ADC typically converts an analog signal to a digital signal by sampling the analog signal at pre-determined sampling intervals and generating a sequence of binary numbers via a quantizer, wherein the sequence of binary numbers is a digital representation of the sampled analog signal. Some of the commonly used types of ADCs include integrating ADCs, Flash ADCs, pipelined ADCs, successive approximation register ADCs, Delta-Sigma ($\Delta\Sigma$) ADCs, two-step ADCs, etc. Of these various types, the pipelined ADCs and the $\Delta\Sigma$ ADCs are particularly popular in applications requiring higher resolutions.

A pipelined ADC circuit samples an analog input signal using a sample-and-hold circuit to hold the input signal steady and a first stage flash ADC to quantize the input signal. The first stage flash ADC then feeds the quantized signal to a digital-to-analog converter (DAC). The pipelined ADC circuit subtracts the output of the DAC from the analog input signal to get a residue signal of the first stage. The first stage of the pipelined ADC circuit generates the most significant bit (MSB) of the digital output signal. The residue signal of the first stage is gained up by a factor and fed to the next stage. Subsequently, the next stage of the pipelined ADC circuit further quantizes the residue signal to generate further bits of the digital output signal.

On the other hand, a $\Delta\Sigma$ ADC employs over-sampling, noise-shaping, digital filtering and digital decimation techniques to provide high resolution analog-to-digital conversion. One popular design of a $\Delta\Sigma$ ADC is multi-stage noise shaping (MASH) $\Delta\Sigma$ ADC. A MASH $\Delta\Sigma$ ADC is based on cascading multiple first-order or second-order $\Delta\Sigma$ ADCs to realize high-order noise shaping. An implementation of a MASH $\Delta\Sigma$ ADC is well known to those of ordinary skill in the art. While both pipelined ADCs and $\Delta\Sigma$ ADCs provide improved signal-to-noise ratio, improved stability, etc., $\Delta\Sigma$ ADCs generally provide higher levels of resolution and therefore are preferred in applications involving asynchronous digital subscriber lines (ADSL), very high speed digital subscriber lines (VDSL), etc. Highly-linear, high-resolution and wide-bandwidth ADCs are required for VDSL systems.

Any stage of a pipelined ADC can be calibrated digitally by inserting a pseudo-random test signal at an input of the stage to be calibrated. However, adding such pseudo-random test signal at one stage may result in such an output signal from the calibrated stage that the stage following the calibrated stage may be saturated. Thus for example, if a first stage of a pipelined ADC is calibrated using a pseudo-random test signal, the second stage of the pipelined ADC will be saturated.

BRIEF DESCRIPTION OF THE DRAWINGS

The present patent is illustrated by way of examples and not limitations in the accompanying figures, in which like references indicate similar elements, and in which.

DETAILED DESCRIPTION OF THE EXAMPLES

An analog-to-digital converter (ADC) system that converts an analog input signal into a digital output circuit uses a method of shaping a pseudo-random signal such that the ADC circuit can be used with input signals having wider swings. The ADC circuit also includes a quantizer having a comparator offset of less than $=/-\frac{1}{4}$ least significant bit (LSB) in a stage calibrated for gain errors. A method of operating the ADC circuit includes measuring an amplitude and polarity of an input signal voltage and changing characteristics of a pseudo-random signal to ensure that a subsequent stage of the ADC circuit is not saturated. An implementation of the ADC circuit alters the pseudo-random signal based on the amplitude of the input signal such that when the input signal goes close to a positive rail, the pseudo-random signal alternates between a first range, and when the input signal goes close to a negative rail, the pseudo-random signal alternates between a second range.

An embodiment of the analog-to-digital converter system for converting an analog input signal to a digital output signal comprises a first stage analog-to-digital converter circuit adapted to receive the analog input signal and to measure a characteristic of the analog input signal; a digital signal modulator adapted to modify a characteristic of a digital test signal based on the characteristic of the analog input signal; and a first combiner circuit adapted to insert the modified digital test signal into the analog input signal in a manner so as to maximize an input range of the analog input signal.

In an alternate embodiment of such an analog-to-digital converter system the first stage analog-to-digital converter circuit is a pipelined analog-to-digital converter circuit of at least 1.5 bit order. In another alternate embodiment of such an analog-to-digital converter system, the first stage analog-to-digital converter circuit is further adapted to measure a characteristic of the analog input signal using a quantizer.

In yet another alternate embodiment of the analog-to-digital converter system the first stage analog-to-digital converter circuit is further adapted to measure one of an amplitude of the analog input signal and a polarity of the analog input signal; and the digital signal modulator is further adapted to modify a characteristic of the digital test signal based on one of the amplitude of the analog input signal and a polarity of the analog input signal. In another alternate embodiment of such an analog-to-digital converter system the first combiner circuit adapted to insert the modified digital test signal into the analog input signal in the first stage analog-to-digital converter circuit.

In yet another alternate embodiment of the analog-to-digital converter system the digital signal modulator adapted to modify a characteristic of the digital test signal in a manner so that when an amplitude of the analog input signal is equal to or higher than a positive reference voltage, the polarity of the digital test signal is negative; and when amplitude of the analog input signal is equal to or lower than a negative reference voltage, the polarity of the digital test signal is positive.

In yet another alternate embodiment of the analog-to-digital converter system, first stage analog-to-digital converter is further adapted to generate a first stage digital output signal, and the system further comprises a second combiner circuit adapted to generate a residue signal as a combination of the first stage digital output signal and the analog input signal; a second stage analog-to-digital converter adapted to generate a second stage digital output signal using the residue signal; and a digital recombiner adapted to recombine the first stage digital output signal and the second stage digital output signal in a manner so as to remove an effect of the digital test signal on the digital output signal. In yet another alternate embodiment of the analog-to-digital converter system the digital recombiner is implemented using one of: (1) hardware; (2) software; or (3) firmware. Whereas in yet another alternate embodiment of the analog-to-digital converter system, the first stage analog-to-digital converter is implemented using one of: (1) a pipelined analog-to-digital converter circuit; (2) a cyclic analog-to-digital converter circuit; or (3) a sigma-delta analog-to-digital converter circuit.

An alternate embodiment of the analog-to-digital converter system provides a method of converting an analog input signal into a digital output signal using an analog-to-digital converter system in a manner so as to maximize the input range of the analog input signal, the analog-to-digital converter system having a first stage analog-to-digital converter and a second stage analog-to-digital converter, the method comprising measuring a characteristic of the analog input signal; varying a characteristic of a digital test signal in response to the characteristic of the analog input signal; and inserting the digital test signal into the analog-to-digital converter system to maximize an input range of the analog input signal.

In an alternate embodiment of the analog-to-digital converter system, inserting the digital test signal into the analog-to-digital converter system includes inserting the digital test signal into the first stage analog-to-digital converter of the analog-to-digital converter system. In yet another alternate embodiment of the analog-to-digital converter system, varying a characteristic of the digital test signal in response to the characteristic of the analog input signal includes changing polarity of the digital test signal to a negative value when amplitude of the analog input signal is equal to or greater than a positive reference voltage; and changing the polarity of the digital test signal to a positive value when the amplitude of the analog input signal is equal to or lesser than a negative reference voltage.

In an alternate embodiment of the analog-to-digital converter system, varying a characteristic of a digital test signal in response to the characteristic of the input signal includes confining input swing of the digital test signal between zero and a negative test signal voltage when amplitude of the analog input signal is above a positive reference voltage; confining the input swing of the digital test signal between zero and a positive test signal voltage when the amplitude of the analog input signal is below a negative reference voltage; and confining the input swing of the digital test signal between the negative test signal voltage and the positive test signal voltage when the amplitude of the analog input signal is above the negative reference voltage and below the positive reference voltage.

Yet another embodiment of the analog-to-digital converter system further comprises generating a first stage digital output signal from the analog input signal; determining a first stage residue signal as a combination of the first stage digital output signal and the analog input signal; generating a second stage digital output signal from the first stage residue signal; and digitally combining the first stage digital output signal and the second stage digital output signal in a manner so as to remove an effect of the digital test signal on the digital output signal.

Figure 1:
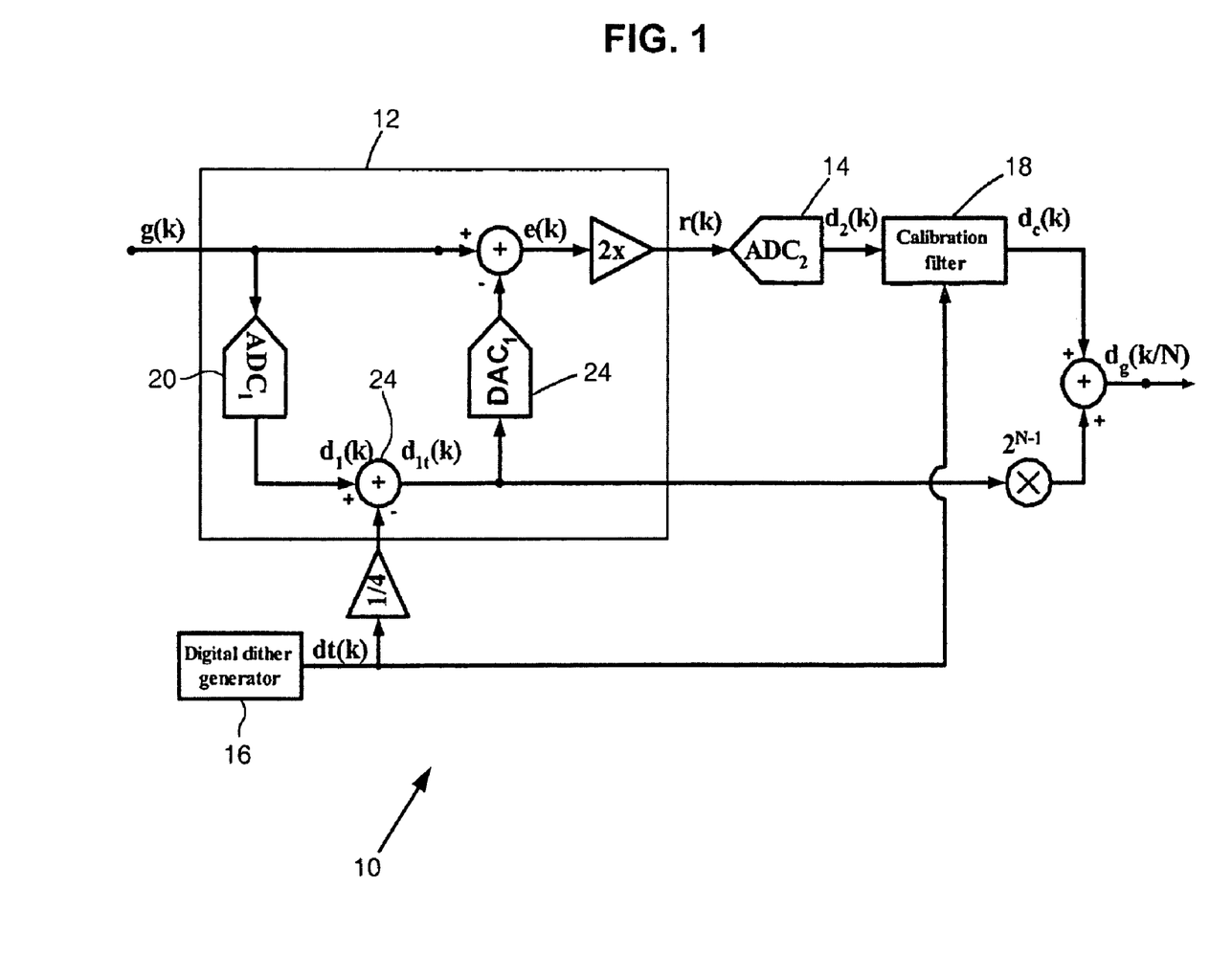
FIG. 1 is a block diagram of a pipelined ADC circuit calibrated in a first stage.

Referring now to the accompanying drawings, FIG. 1 illustrates an ADC system 10 that converts an analog input signal g(k) into a digital output signal $d_g(k/N)$. The ADC system 10 includes a first stage 12 cascaded with a second stage 14. The ADC system 10 also includes a digital dither generator 16 to generate a dither signal dt(k) (also known as pseudo-random signal), and a calibration filter 18. The second stage 14 is represented by an ADC labeled $ADC_2$ 14.

The first stage 12 includes an ADC labeled $ADC_1$ 20 and a feedback DAC 22. The $ADC_1$ 20 converts the analog input signal g(k) into a digital signal d1(k). A summation circuit 24 combines the digital signal d1(k) with the dither signal d(t) to generate a combined signal $d_{1r}(k)$. The signal $d_{1r}(k)$ is input into the feedback DAC 22, which converts it into an analog signal. The output of the feedback DAC 22 is subtracted from the analog input signal g(k) to generate a residue signal e(k), which is amplified by an amplifying circuit 24 to give the input signal r(k) for the $ADC_2$ 14.

An output d2(k) of the $ADC_2$ 14 may be input into the calibration filter 18 for calibrating the first stage 12. The purpose of the calibration filter 18 is to digitally compensate for any errors introduced in the first stage 12.

Figure 2A:
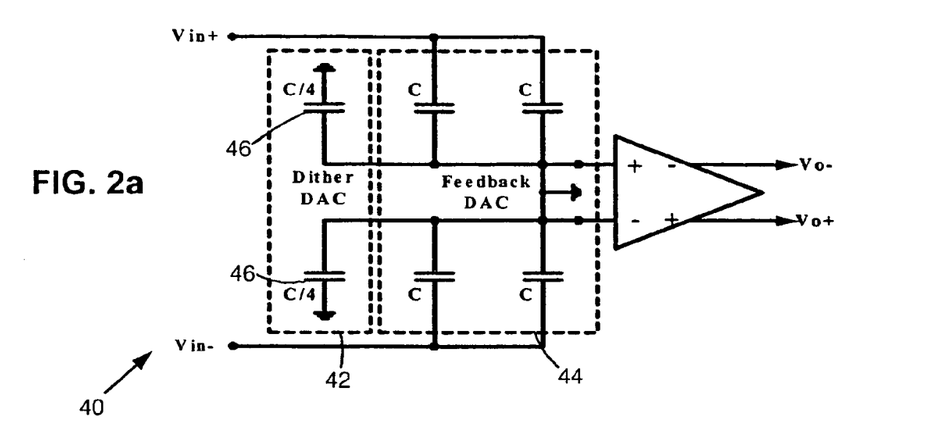
FIGS. 2a and 2b illustrate circuit diagrams of a calibrated ADC stage.
Figure 2B:
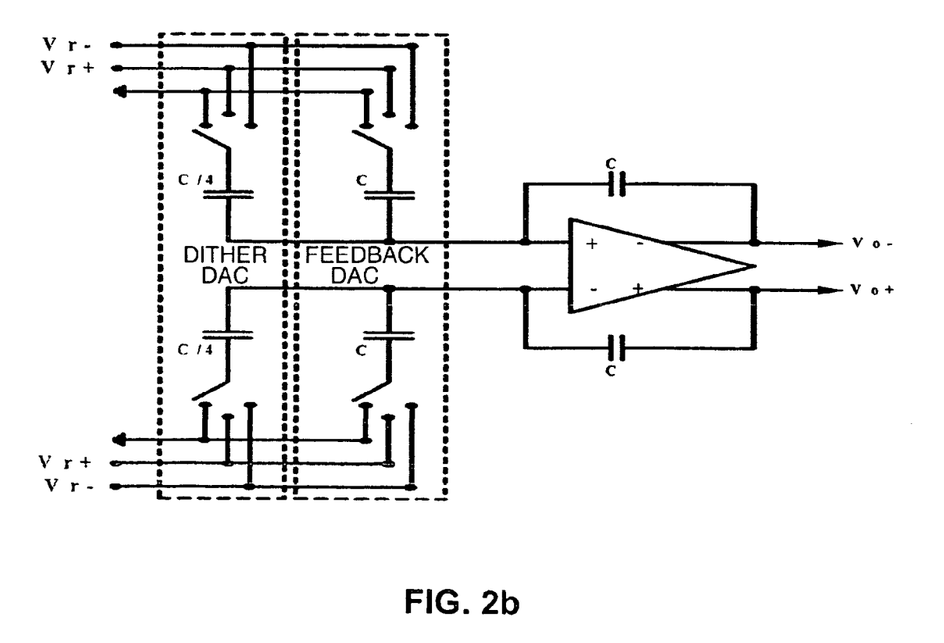

FIG. 2 illustrates exemplary circuit diagrams of a 1.5 bit ADC stage that may be used as the first stage 12 of FIG. 1. Specifically, FIG. 2a shows a 1.5 bit ADC stage 40 having a dithering DAC 42 and a feedback DAC 44. The capacitors 46 of the dithering DAC 42 are used to insert the pseudo-random signal d(t) into the ADC system 10. FIG. 2b shows an alternate implementation of the first stage 12 being used in a sampling phase of its operation.

For implementations of the first stage 12 in a manner shown in FIG. 2, the resolution of the first stage 12 does not increase with 2 bits to fit the ¼ bit dither. Also note that a unit capacitor equal to ¼ capacitance of a feedback DAC is necessary to input the pseudo-random signal into the ADC system 10. generally, in such a situation, addition of the pseudo-random signal d(t) will cause the output voltage of the first stage 12 to exceed the range of +/−Vref, which may cause subsequent stages of the ADC system 10 to saturate.

Figure 4A:
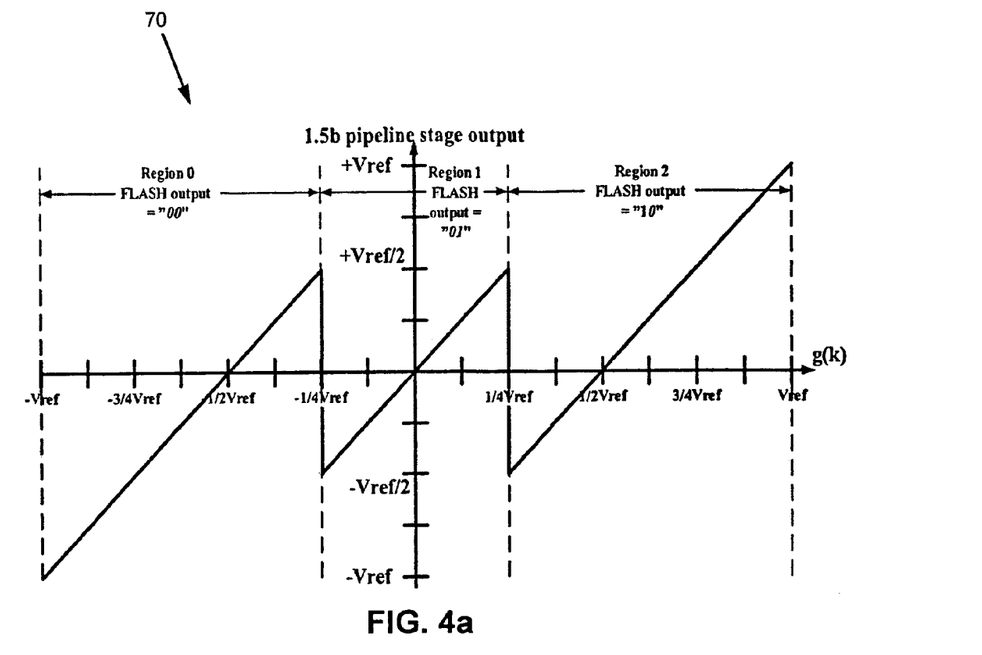
FIGS. 4a and 4b illustrate transfer functions of a calibrated ADC stage.

Such saturation of the subsequent stages is further illustrated by a transfer function 70 of FIG. 4a.

Figure 3:
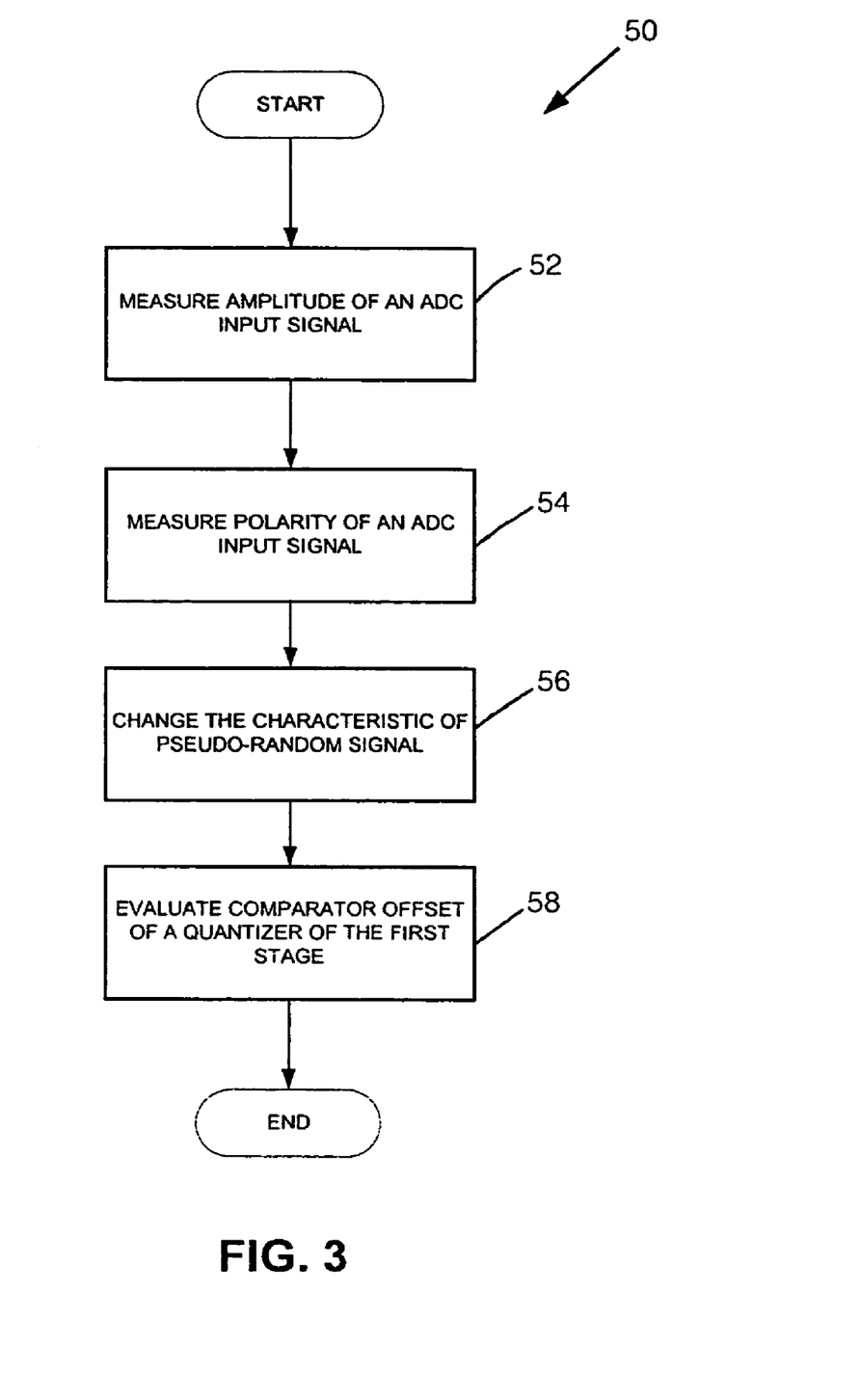
FIG. 3 is a flowchart that illustrates operating a calibrated ADC stage with wider input signal swings.

FIG. 3 illustrates a flowchart 50 of a method used by the ADC system 10 to ensure that when the first stage 12 is calibrated using a dither signal, it does not saturate subsequent stages of the ADC system 10. The flowchart 50 illustrates the method for a dither signal that nominally varies between voltages with magnitude of +Vdt and −Vdt. The flowchart 50 may be implemented for a particular stage of an ADC system by using a quantizer of that particular stage to control the dither.

Now referring to FIG. 3, a block 52, the ADC system 10 measures the amplitude of the input signal g(k) whereas a block 54 measures the polarity of the input signal g(k).

Subsequently, a block 56 changes the characteristics of the dither signal dt. Specifically, when the input signal goes close to the positive rail, the dither shifts characteristics, and varies between 0 and −Vdt. When the input goes close to the negative rail, the dither should vary between 0 and +Vdt. This way, the additional dither will never add in-phase with the input signal when the input is close to one of the rails, and a full scale input voltage range is ensured.

Subsequently, a block 58 ensures that the comparator offset of a stage quantizer is less than +/−¼ LSB.

As illustrated below with various transfer functions of an ADC stage, using the method described in FIG. 3 ensures full scale swing of an analog input signal to a dithered stage of an ADC system.

FIG. 4a illustrates transfer function of an ideal 1.5 bit pipelined ADC stage that has an output voltage swing of +/−0.5 Vref, resulting from ideal quantization noise of a quantizer used in the pipelined ADC stage. In FIG. 4a, three distinct regions of the transfer function 70 for such an ideal 1.5 bit pipeline stage can be identified. The separation between each region is where the output voltage has an abrupt shift. Referring each region to the input signal g(k) as shown in FIG. 4a below, region 0 ranges from −Vref to ¼ Vref, region 1 ranges from −¼ Vref to ¼ Vref, and region 2 ranges from ¼ Vref to 1 Vref. The regions correspond to the decisions of the in-stage $ADC_1$ 20. The transfer function of the pipeline stage is different for each of the regions 0, 1 and 2.

In region 0, the transfer function of the 1.5 b pipeline ADC stage is y=2g+Vref.

In region 1, the transfer function of the 1.5 b pipeline ADC stage is y=2g.

In region 2, the transfer function of the 1.5 b pipeline ADC stage is y=2g−Vref.

With zero comparator offset, FIG. 4 shows that the output voltage of the pipeline stage has a local maximum/minimum when the input crosses the references to the $ADC_1$ 20. The global maximum/minimum of the output voltage occurs when the input voltage is maximum or minimum.

Figure 4B:
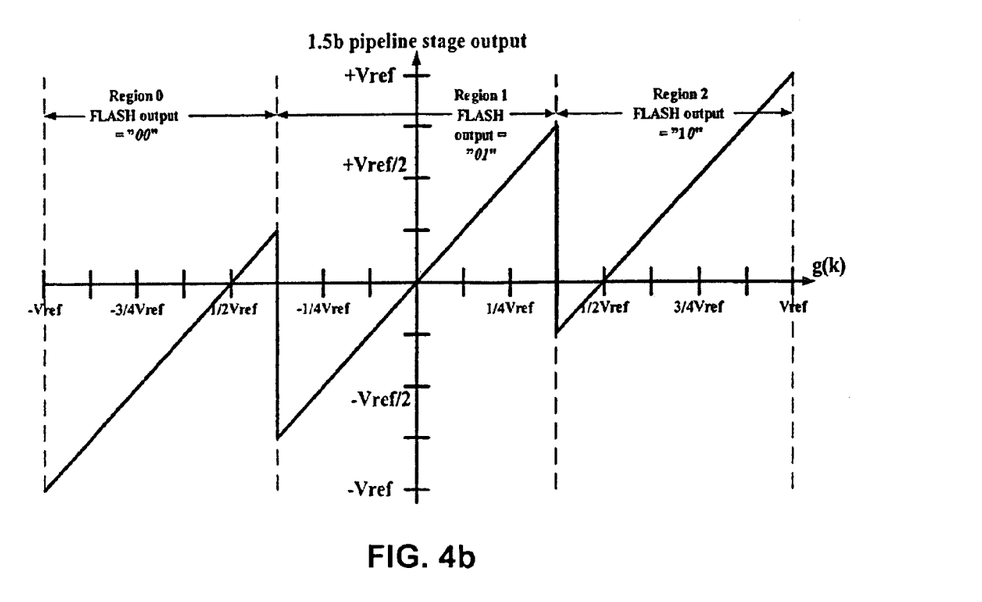

FIG. 4b illustrates a transfer function of a 1.5 bit pipelined ADC stage with +/−¼ LSB comparator offset. Assume that the real reference of $ADC_1$ 20 has shifted from −¼ Vref to −⅜ Vref, as shown in FIG. 4b. In the case where the input g(k) is slightly above −⅜ Vref, the output of the pipeline stage becomes:

$$y=2*(-)⅜\ Vref=-⅝\ Vref=-0.75\ Vref.$$

Thus, the local minimum has increased from −0.5 Vref to −0.75 Vref. However, the global minimum is still at −1 Vref, and occurs when the input voltage is −1 Vref.

Furthermore, FIG. 4b also illustrates that while a non-dithered pipeline ADC stage can tolerate +/−½ LSB offset, in a dithered case, it is desirable that the ADC stage quantizer's offset is less than +/−¼ LSB. In this example, the comparator offset is −¼ LSB, and the reference voltage has shifted from −¼ Vref to −⅜ Vref. When the input signal is slightly above −⅜ Vref so that the region of operation is region 1, the equation for the output signal becomes $$y=2g+dt*Vref/4=-¾\ Vref+dt*Vref/4$$

Because the dither dt is a two-level signal that is either +1 or −1, the two possible output values can be given by:

$$dt=-1:\ y=-¾\ Vref-Vref/4=-Vref$$

$$dt=1:\ y=-¾\ Vref+Vref/4=-½\ Vref$$

Thus, it can be seen that if the comparator offset is ¼ LSB, the maximum output after dithering is −Vref, and therefore, the subsequent stages will not saturate.

Figure 5A:
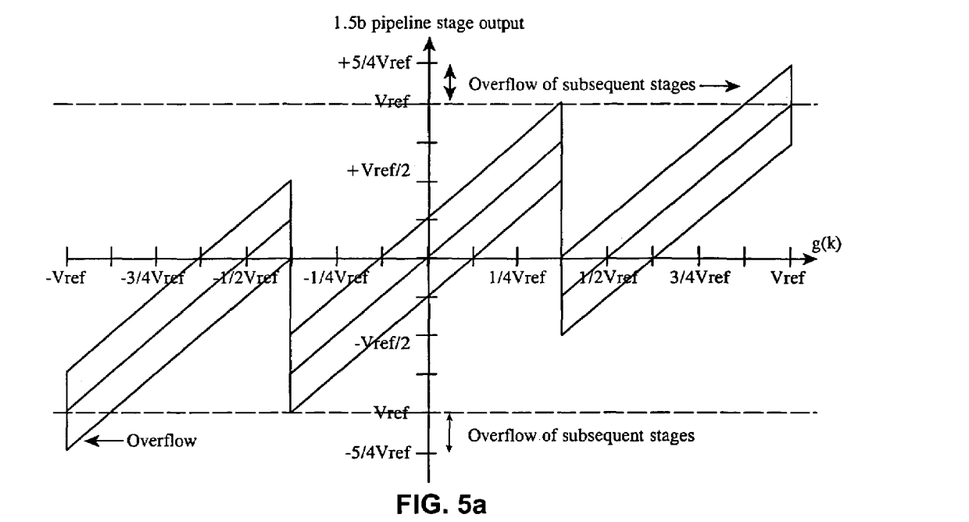
FIGS. 5a and 5b illustrate transfer functions of a calibrated ADC stage including pseudo-random signals.

FIG. 5a illustrates a transfer function of an ideal 1.5 bit pipelined ADC stage. In FIG. 5a, the pseudorandom signal dt is either +1 or −1. Thus, when the input signal is −Vref, the output signal becomes $$dt=-1:\ y=-Vref-Vref/4=-5/4\ Vref$$

$$dt=1:\ y=-Vref+Vref/4=-¾\ Vref$$

Thus, in the worst case the magnitude of the output becomes −5/4 Vref, which will lead to saturation of the subsequent pipeline ADC stages.

Figure 5B:
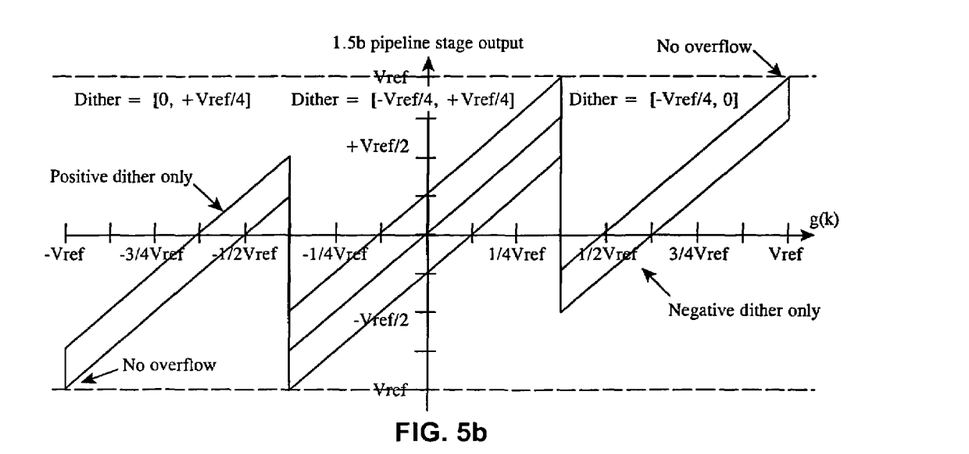

FIG. 5b illustrates how to correct the problem identified in FIG. 5a. Specifically, FIG. 5b shows that in region 0, the dither is modified so that it is either 0 or +1.

In this case, when the input is −Vref, the output becomes $$dt=0:\ y=-Vref$$

$$dt=1:\ y=-Vref+Vref/4=-¾\ Vref$$

As a result, the maximum output voltage is −Vref, and the subsequent pipeline stages do not saturate.

Figure 6:
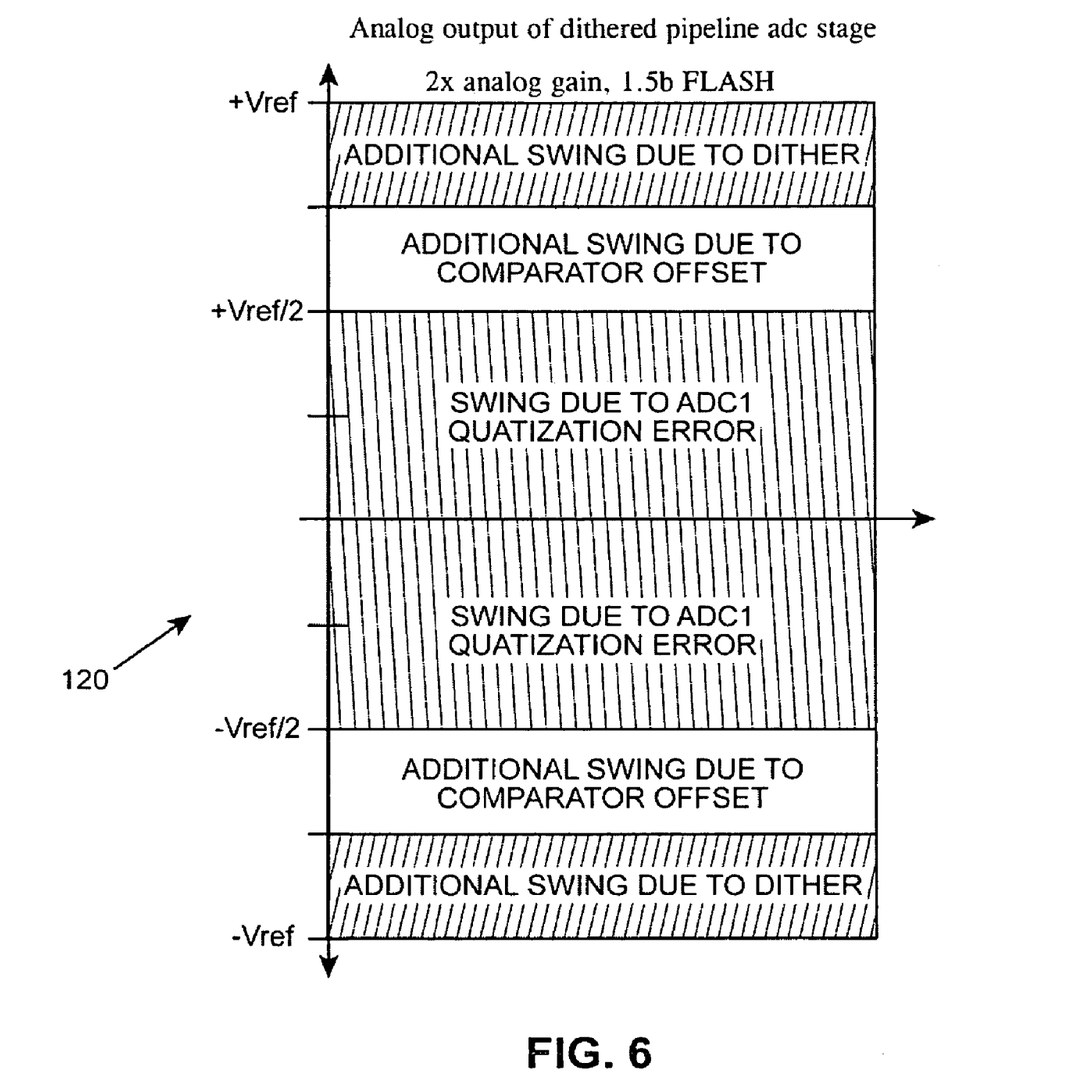
FIG. 6 is an exemplary signal diagram of an output signal of a calibrated ADC stage.

FIG. 6 is an exemplary signal diagram 120 of an output signal d1(k) of the first stage 12, when it is implemented as a 1.5 bit pipelined ADC stage. The diagram 120 shows how origins of a maximum output voltage swing from a 1.5 bit pipeline ADC stage with an analog gain of two can be divided into quantization error, comparator offset and digital dithering. Specifically, the diagram 120 shows that the total output swing of d1(k) is +/−1 $V_{ref}$. Of this total output swing, a swing of +/−0.5 $V_{ref}$ is due to the quantization noise of the first stage 12 in a 1.5 bit pipeline ADC stage implementation. This will be the total output swing in absence of dither and when the comparators are ideal. The dither dt(k) introduces an additional +/−0.25 $V_{ref}$ swing when the dither DAC 94 uses a ¼ unit capacitor. In this configuration, the maximum tolerable comparator offset is +/−¼ LSB of the 1.5 bit pipeline ADC stage, resulting in additional +/−0.25 $V_{ref}$ swing. For example, when $V_{ref}$ equals 1V, the LSB of the 1.5 bit pipeline ADC stage equals 250 mV, and the tolerable comparator offset is +/−62.5 mV. Thus, to fit dither dt(k) in a residue voltage budget, the comparators of the $ADC_1$ 20 must be designed for 4 bit accuracy. In this design, the dither dt(k) is controlled by a 1 bit pseudo-random signal that is interpreted as positive dither if equal to '1', and negative dither if equal to '0'. In order to ensure maximum swing of the input signal, the dither changes magnitude when the $ADC_1$ 20 sees an input signal that is close to one of the rails. With an input near positive rail, the dither is only allowed to switch between maximum negative dither and zero. Similarly, with an input near negative rail, the dither is only allowed to switch between maximum positive input and zero.

Figure 7A:
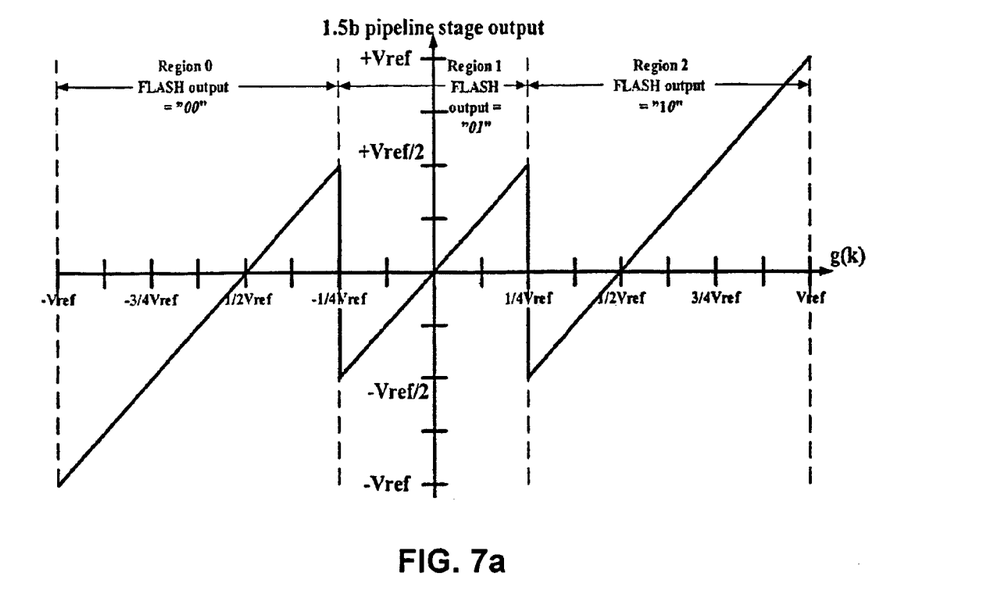
FIGS. 7a and 7b illustrate further transfer functions of a calibrated ADC stage.
Figure 7B:
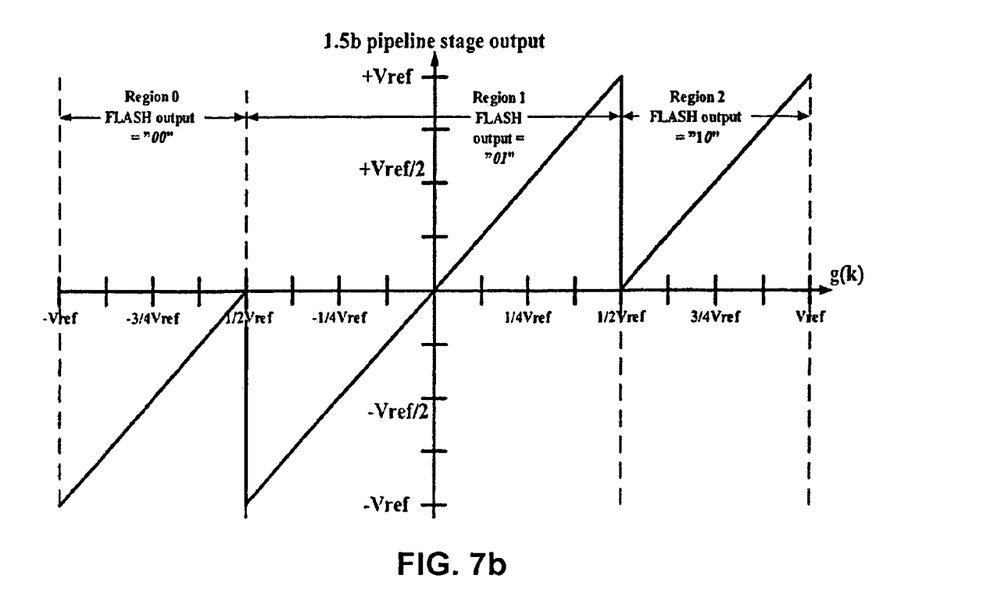

FIG. 7 illustrates transfer functions of an ideal 1.5 bit pipelined ADC stage and a 1.5 bit pipelined ADC stage with +/−½ LSB comparator offset. As seen in FIG. 7a, in regions 0 and region 2, dithering the 1.5 bit pipelined ADC stage may result in saturating subsequent ADC stages. FIG. 7b shows that such saturation of subsequent ADC stages can be avoided by applying the method illustrated in FIG. 3.

Specifically, FIG. 7b illustrates a case where the comparator offset is −½ LSB, and the comparator reference has shifted from −Vref/4 to −Vref/2 due to the comparator offset. As illustrated in FIG. 7b, without dithering the output voltage never exceeds +/−Vref, and the subsequent stages will not saturate.

The case when dithering is turned on is explained below. Assume that the input voltage is slightly above −½ Vref, and the output of the pipeline stage is in the region 1. In this case the equation for the output becomes $$y = 2g = -\tfrac{1}{2}\text{Vref}*2 + dt*\text{Vref}/4 = -\text{Vref} + dt*\text{Vref}/4$$

Since the dither signal dt can take on the values +1 or −1, the two cases below apply $$dt=-1: y=-\text{Vref}-\text{Vref}/4=-\tfrac{5}{4}\text{Vref}$$

$$dt=1: y=-\text{Vref}+\text{Vref}/4=-\tfrac{3}{4}\text{Vref}$$

Therefore, the maximum output voltage becomes −⁵⁄₄ Vref, and the subsequent pipeline ADC stages will saturate. Therefore, FIG. 7 illustrates that a comparator offset equal to ½ LSB results in an output voltage swing of the pipeline stage that exceeds the input range of the next stage.

In summary, the method disclosed herein allows digitally dithering a pipeline ADC stage while ensuring full scale input voltage range. The method works even for 1.5 b pipeline ADC stages with little extra circuitry, and is therefore attractive for high-speed pipelined ADCs that need gain calibration. This method is well suited for pipelined ADC stages with higher than 1.5 b resolution per stage. However, it can also be used for ΔΣ ADCs.

Although the forgoing text sets forth a detailed description of numerous different embodiments of the invention, it should be understood that the scope of the invention is defined by the words of the claims set forth at the end of this patent. The detailed description is to be construed as exemplary only and does not describe every possible embodiment of the invention because describing every possible embodiment would be impractical, if not impossible. Numerous alternative embodiments could be implemented, using either current technology or technology developed after the filing date of this patent, which would still fall within the scope of the claims defining the invention.

Thus, many modifications and variations may be made in the techniques and structures described and illustrated herein without departing from the spirit and scope of the present invention. Accordingly, it should be understood that the methods and apparatus described herein are illustrative only and are not limiting upon the scope of the invention.

What is claimed is:

1. A method of converting an analog input signal into a digital output signal using an analog-to-digital converter system, the analog-to-digital converter system having a first stage analog-to-digital converter and a second stage analog-to-digital converter, the method comprising:
measuring a characteristic of the analog input signal;
varying a characteristic of a digital test signal in response to the characteristic of the analog input signal; and
inserting the digital test signal into the analog-to-digital converter system;
wherein varying a characteristic of the digital test signal in response to the characteristic of the input signal includes:
confining an input swing of the digital test signal between zero and a negative test signal voltage when an amplitude of the analog input signal is above a positive reference voltage, and
confining the input swing of the digital test signal between zero and a positive test signal voltage when the amplitude of the analog input signal is below a negative reference voltage.

2. A method of claim 1, wherein inserting the digital test signal into the analog-to-digital converter system includes inserting the digital test signal into the first stage analog-to-digital converter of the analog-to-digital converter system.

3. A method of claim 1, wherein measuring a characteristic of the analog input signal includes measuring one of amplitude or polarity of the analog input signal.

4. A method of claim 1, wherein varying a characteristic of the digital test signal in response to the characteristic of the analog input signal includes:
changing polarity of the digital test signal to a negative value when amplitude of the analog input signal is equal to or greater than the positive reference voltage; and
changing the polarity of the digital test signal to a positive value when the amplitude of the analog input signal is equal to or lesser than the negative reference voltage.

5. A method of claim 1, wherein varying a characteristic of a digital test signal in response to the characteristic of the input signal further includes:
confining the input swing of the digital test signal between the negative test signal voltage and the positive test signal voltage when the amplitude of the analog input signal is above the negative reference voltage and below the positive reference voltage.

6. A method of claim 1, further comprising:
generating a first stage digital output signal from the analog input signal;
determining a first stage residue signal as a combination of the first stage digital output signal and the analog input signal;
generating a second stage digital output signal from the first stage residue signal; and
digitally combining the first stage digital output signal and the second stage digital output signal in a manner so as to remove an effect of the digital test signal on the digital output signal.

7. A method of claim 6, wherein digitally combining the first stage digital output signal and the second stage digital output signal includes digitally combining the first stage digital output signal and the second stage digital output signal using one of: (1) hardware; (2) software; or (3) firmware.

8. A method of claim 6, wherein generating the first stage digital output signal from the analog input signal includes generating the first stage digital output signal from the analog input signal using one of: (1) a pipelined analog-to-digital converter circuit; (2) a cyclic analog-to-digital converter circuit; or (3) a sigma-delta analog-to-digital converter circuit.

9. A method of claim 6, wherein generating the first stage digital output signal from the analog input signal includes generating the first stage digital output signal from the analog input signal using a pipelined analog-to-digital converter circuit of at least 1.5 bit order.

10. A method of claim 1, wherein varying the characteristic of the digital test signal in response to the characteristic of the input signal includes varying the digital test signal from a two level digital test signal to a three level digital test signal.

11. A method of claim 1, wherein measuring a characteristic of the analog input signal includes measuring a characteristic of the analog input signal using a quantizer located in the first stage analog-to-digital converter.

12. An analog-to-digital converter system for converting an analog input signal to a digital output signal, the system comprising:
   a first stage analog-to-digital converter circuit adapted to receive the analog input signal, to generate a digital representation of the analog input signal, and to measure a characteristic of the analog input signal;
   a digital signal modulator adapted to modify a characteristic of a digital test signal based on the characteristic of the analog input signal; and
   a first combiner circuit adapted to insert the modified digital test signal into the digital representation of the analog input signal;
   wherein the digital signal modulator is adapted to modify the characteristic of the digital test signal in a manner so that when an amplitude of the analog input signal is equal to or higher than a positive reference voltage, the polarity of the digital test signal is negative, and when the amplitude of the analog input signal is equal to or lower than a negative reference voltage, the polarity of the digital test signal is positive.

13. A system of claim 12, wherein the first stage analog-to-digital converter circuit is a pipelined analog-to-digital converter circuit of at least 1.5 bit order.

14. A system of claim 13, wherein the first stage analog-to-digital converter circuit is further adapted to measure the characteristic of the analog input signal using a quantizer.

15. A system of claim 12, wherein:
   the first stage analog-to-digital converter circuit is further adapted to measure one of the amplitude of the analog input signal and a polarity of the analog input signal; and
   the digital signal modulator is further adapted to modify the characteristic of the digital test signal based on one of the amplitude of the analog input signal and a polarity of the analog input signal.

16. A system of claim 12, wherein the first combiner circuit is adapted to insert the modified digital test signal into the digital representation of the analog input signal in the first stage analog-to-digital converter circuit.

17. A system of claim 12, wherein the first stage analog-to-digital converter is further adapted to generate a first stage digital output signal, the system further comprising:
   a second combiner circuit adapted to generate a residue signal as a combination of the first stage digital output signal and the analog input signal;
   a second stage analog-to-digital converter adapted to generate a second stage digital output signal using the residue signal; and
   a digital recombiner adapted to recombine the first stage digital output signal and the second stage digital output signal in a manner so as to remove an effect of the digital test signal on the digital output signal.

18. A system of claim 12, wherein the digital recombiner is implemented using one of: (1) hardware; (2) software; or (3) firmware.

19. A system of claim 12, wherein the first stage analog-to-digital converter is implemented using one of: (1) a pipelined analog-to-digital converter circuit; (2) a cyclic analog-to-digital converter circuit; or (3) a sigma-delta analog-to-digital converter circuit.

* * * * *

UNITED STATES PATENT AND TRADEMARK OFFICE
CERTIFICATE OF CORRECTION

| | |
|---|---|
| PATENT NO. | : 7,221,299 B2 |
| APPLICATION NO. | : 11/151934 |
| DATED | : May 22, 2007 |
| INVENTOR(S) | : Johnny Bjornsen |

It is certified that error appears in the above-identified patent and that said Letters Patent is hereby corrected as shown below:

On the Title Page:

Item (54), "METHOD AND APPARATUS FOR AN ADC CIRCUIT WITH WIDER INPUT SIGNAL SWING" should be -- METHOD AND APPARATUS FOR OPERATING AN ADC CIRCUIT WITH WIDER INPUT SIGNAL SWING --.

In the Specification:

At Column 1, lines 1-3, "METHOD AND APPARATUS FOR AN ADC CIRCUIT WITH WIDER INPUT SIGNAL SWING" should be -- METHOD AND APPARATUS FOR OPERATING AN ADC CIRCUIT WITH WIDER INPUT SIGNAL SWING --.

Signed and Sealed this

Twenty-second Day of December, 2009

David J. Kappos
*Director of the United States Patent and Trademark Office*